United States Patent
Park et al.

(10) Patent No.: US 7,773,415 B2
(45) Date of Patent: Aug. 10, 2010

(54) FLASH MEMORY DEVICE CAPABLE OF PREVENTING SOFT-PROGRAMMING DURING A READ OPERATION AND READING METHOD THEREOF

(75) Inventors: Dae-Sik Park, Hwaseong-si (KR); Jin-Yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/292,741

(22) Filed: Nov. 25, 2008

(65) Prior Publication Data

US 2009/0135658 A1 May 28, 2009

(30) Foreign Application Priority Data

Nov. 26, 2007 (KR) ............... 10-2007-0120845

(51) Int. Cl.
*G11C 16/26* (2006.01)
(52) U.S. Cl. .................. 365/185.02; 385/185.17; 385/185.25; 385/185.33; 385/185.18
(58) Field of Classification Search ............ 365/185.17, 365/185.25, 185.28, 185.33, 185.18, 185.02, 365/185.12, 185.11
See application file for complete search history.

(56) References Cited

U.S. PATENT DOCUMENTS

| | | | |
|---|---|---|---|
| 5,473,563 A | 12/1995 | Suh et al. | |
| 5,696,717 A | 12/1997 | Koh | |
| 5,761,132 A | 6/1998 | Kim | |
| 5,973,962 A | 10/1999 | Kwon | |
| 7,304,894 B2 | 12/2007 | Joo | |
| 7,333,366 B2 * | 2/2008 | Abedifard | 365/185.17 |
| 7,423,908 B2 * | 9/2008 | Kim et al. | 365/185.23 |
| 2005/0254309 A1 | 11/2005 | Kwon et al. | |
| 2009/0135658 A1 * | 5/2009 | Park et al. | 365/185.23 |

FOREIGN PATENT DOCUMENTS

| | | |
|---|---|---|
| KR | 10-1999-0057230 A | 7/1999 |
| KR | 10-2005-0109835 A | 11/2005 |
| KR | 10-2006-0107697 A | 10/2006 |

\* cited by examiner

*Primary Examiner*—Andrew Q Tran
(74) *Attorney, Agent, or Firm*—Lee & Morse P.C.

(57) ABSTRACT

A flash memory device includes a memory block including word lines arranged between a first selection line and a second selection line, the word lines being divided into a first group and a second group, a control logic configured to determine an activation order of the first and second selection lines and determine first and second read voltages to be supplied to unselected word lines, the control logic determining the activation order according to whether a selected word line belongs to the first group or the second group, and a row selection circuit configured to, during a read operation, drive the unselected word lines with the first and second read voltages, and activate the first and second selection lines, according to the control logic.

17 Claims, 6 Drawing Sheets

FLASH MEMORY DEVICE CAPABLE OF PREVENTING SOFT-PROGRAMMING DURING A READ OPERATION AND READING METHOD THEREOF

BACKGROUND

1. Technical Field

Embodiments relate to a flash memory device. More particularly, embodiments relate to a flash memory device configured to prevent a soft program effect during a read operation.

2. Description of the Related Art

In general, a flash memory device is a type of an EEPROM wherein a plurality of memory regions are programmed or erased by a single program or erase operation. As the EEPROM is able to be electrically erased and programmed, it is widely applied in system programming and in supplementary memory devices. Particularly, a flash EEPROM (also referred to herein as a "flash memory") has advantages when applied as a large-capacity supplementary memory device because the flash EEPROM may be more highly integrated than a conventional EEPROM. A flash memory device may be classified as a NAND flash memory device or a NOR flash memory device depending on the form of logic gate. Generally, the NAND flash memory device is more highly-integrated than the NOR flash memory device.

FIG. 1 illustrates a block diagram of a NAND flash memory device 10. Referring to FIG. 1, the NAND flash memory device 10 may include a memory cell array 20, a row selection circuit 40 (identified as "X-SEL" in FIG. 1), and a page buffer circuit 60.

The memory cell array 20 may include a plurality of cell strings 21, i.e., NAND strings, each connected to corresponding bit lines BL0 to BLm-1. The cell string 21 of each column may include a string selection transistor SST as a first selection transistor, a ground selection transistor GST as a second selection transistor, and a plurality of flash EEPROM cells, i.e., memory cells, MC0 to MCn-1 connected in series between the selection transistors SST and GST. The string selection transistor SST of each column may have a gate connected to a string selection line SSL and a drain connected to a corresponding bit line. The ground selection transistor GST may have a source connected to a common source line CSL and a gate connected to the ground selection line GSL. The memory cells MCn-1 to MC0 may be connected in series between the source of the string selection transistor SST and the drain of the ground selection transistor GST. The cells of each cell string may consist of floating gate transistors whose control gates are connected to corresponding word lines WLn-1 to WL0, respectively. The string selection line SSL, the word lines WL0 to WLn-1, and the ground selection line GSL may be electrically connected to the row selection circuit 40. The bit lines BL0 to BLm-1 arranged on the memory cell array 20 may be electrically connected to the page buffer circuit 60.

The row selection circuit 40 may select one word line from among the word lines WL0 to WLn-1 according to the row address information, and may provide word line voltages to selected and unselected word lines according to each mode of operation, respectively. For example, the row selection circuit 40 may supply a program voltage to a selected word line and supply a pass voltage to unselected word lines during a program mode of operation. The page buffer circuit 60 may supply a power voltage, i.e., a program-inhibited voltage, or a ground voltage, i.e., a program voltage, to the bit lines BL0 to BLm-1 respectively, according to data to be programmed during a program mode of operation. Memory cells of the NAND flash memory 10 may be erased and programmed by using a Fowler-Nordheim tunneling current. During a read mode of operation, i.e., a read operation, the row selection circuit 40 may supply a ground voltage GND to a selected word line, and may supply a read voltage to unselected word lines.

The page buffer circuit 60 may recognize data transferred from memory cells of the selected word line by means of the bit lines BL0 to BLm-1 during a read/verification mode of operation. Through the recognition operation of the page buffer circuit 60, it may be determined whether the memory cell is a programmed cell or an erased cell.

The read mode of operation may include bit line discharge, bit line precharge, bit line development, and sensing intervals, in that order. Bit lines may be discharged during the bit line discharge interval. The discharged bit lines may be precharged during the bit line precharge interval so as to have a predetermined precharge level. Also, after the bit lines are discharged, during the bit line precharge interval, a read voltage Vread (e.g. +4.5V) may be applied to the unselected word lines and 0V may be supplied to the selected word line. During the bit line development interval, where the memory cell connected to the selected word line is an erased cell, i.e., an on-cell, the precharge level of the bit line may fall to a low level, e.g., a ground level. However, if the memory cell is a programmed cell, i.e., an off-cell, the precharge level of the bit line may be maintained. Likewise, the precharge levels of the bit lines may vary according to the program state of the memory cells, which is called a bit line development. The precharge levels of the bit lines may be sensed during the sensing interval by the page buffer circuit 60. Through this read operation, it may be determined whether a memory cell is an erased cell or a programmed cell.

During a read mode of operation, when a read voltage is supplied to the string selection line SSL or the ground selection line GSL during a bit line development interval, a word line adjacent to the string selection line SSL or adjacent to the ground selection line GSL may have a higher voltage than the read voltage as a result of a coupling effect. In this case, the cells connected to the word line adjacent to the string selection line SSL or adjacent to the ground selection line GSL may be undesirably soft programmed.

SUMMARY

Embodiments are therefore directed to a flash memory device and a read method thereof, which substantially overcome one or more of the problems due to the limitations and disadvantages of the related art.

It is therefore a feature of an embodiment to provide a flash memory device configured to prevent a soft program effect that may occur in the memory cells connected to a word line adjacent to a string selection line or connected to a word line adjacent to a ground selection line.

At least one of the above and other features and advantages may be realized by providing a flash memory device, including a memory block including word lines arranged between a first selection line and a second selection line, the word lines being divided into a first group and a second group, a control logic configured to determine an activation order of the first and second selection lines and determine first and second read voltages to be supplied to unselected word lines, the control logic determining the activation order according to whether a selected word line belongs to the first group or the second group, and a row selection circuit configured to, during a read operation, drive the unselected word lines with the first and second read voltages, and activate the first and second selection lines, according to the control logic.

The first group may be adjacent to the first selection line, the first selection line being a ground selection line, and the second group may be adjacent to the second selection line, the second selection line being a string selection line.

The first read voltage may be lower than the second read voltage. The first read voltage may be set such that, when increased due to a coupling effect, the voltage is not higher than the second read voltage.

When the selected word line belongs to the first group, the row selection circuit may drive the unselected word line adjacent to the second selection line with the first read voltage. The row selection circuit may supply the second read voltage to the remaining unselected word line, except for the unselected word line that is supplied with the first read voltage. The second selection line may be activated during a bit line development interval, and the first selection line may be activated during a bit line precharge interval.

When the selected word line belongs to the second group, the row selection circuit may drive the unselected word line adjacent to the first selection line with the first read voltage. The row selection circuit may supply the second read voltage to the remaining unselected word line, except for the unselected word line supplied with the first read voltage. The first selection line may be activated during a bit line development interval, and the second selection line may be activated during a bit line precharge interval.

At least one of the above and other features and advantages may also be realized by providing a method of reading a flash memory device that includes a memory block having word lines arranged between first and second selection lines, the word lines being divided into a first group and a second group, the method including determining whether a selected word line belongs to the first group or the second group, determining an activation order of the first and second selection lines according to whether the selected word line belongs to the first group or the second group, determining first and second read voltages to be supplied to unselected word lines, and during a read operation, driving the unselected word lines with the first and second read voltages, and activating the first and second selection lines.

The first group may be adjacent to the first selection line, the second group may be adjacent to the second selection line, the first selection line may be a ground selection line, and the second selection line may be a string selection line.

The first read voltage may be provided to a word line, adjacent to one of the selection lines, of unselected word lines of a group to which no selected word line belongs, and the second read voltage may be higher than the first read voltage and may be provided to word lines except for word lines adjacent to one of the selection lines.

The method may further include activating the first selection line, and activating the second selection line during a bit line development interval. The first read voltage may be supplied to the unselected word line adjacent to the second selection line during a bit line precharge interval, when the selected word line belongs to the first group, and the second read voltage may be supplied to the remaining unselected word lines that belong to the first and second groups.

The method may further include activating the second selection line, and activating the first selection line during the bit line development. The first read voltage may be supplied to the unselected word line adjacent to the first selection line during bit line precharge, when the selected word line belongs to the second group, and the second read voltage may be supplied to the remaining unselected word lines that belong to the first and second groups.

At least one of the above and other features and advantages may also be realized by providing a memory system, including a flash memory device, and a memory controller configured to control the flash memory device. The flash memory device may be a flash memory device according to an embodiment.

At least one of the above and other features and advantages may also be realized by providing a computing system, including a microprocessor, a flash memory device, and a memory controller configured to control the flash memory device according to a request from the microprocessor. The flash memory device may be a flash memory device according to an embodiment.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
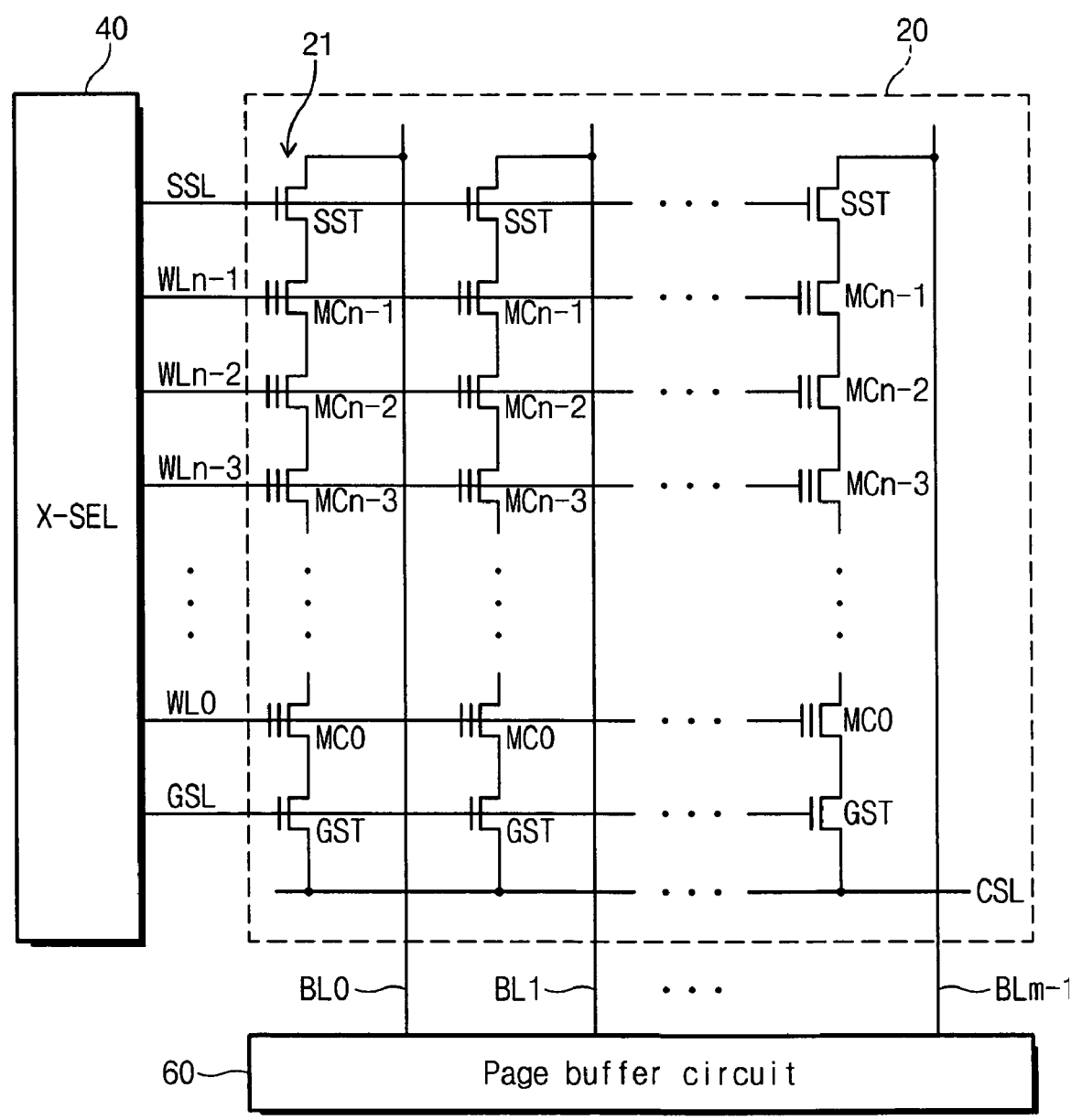
FIG. 1 illustrates a block diagram of a NAND flash memory device.

Korean Patent Application No. 10-2007-0120845, filed on Nov. 26, 2007, in the Korean Intellectual Property Office, and entitled: "Flash Memory Device and Read Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

A flash memory device according to an embodiment may supply a first read voltage, lower than a second read voltage, to a word line that is adjacent to a string selection line or to a ground selection line. Therefore, although the voltage of the word line adjacent to the activated string selection line or adjacent to the ground selection line may rise as a result of a coupling effect, a soft program effect of the flash memory device may nonetheless be prevented.

The flash memory device according to an embodiment may include a memory block that has word lines divided into a first group and a second group, and arranged between first and second selection lines. The flash memory device may further include a control logic that determines an activation order of the first and second selection lines, and determines first and second read voltages to be supplied to unselected word lines, based upon whether a selected word line belongs to the first group or the second group. The flash memory device may further include a row selection circuit that drives the unselected word lines with the first and second read voltages, and activates the first and second selection lines during read operation, according to the determined result from the control logic. Thus, the flash memory device according to an embodiment may supply the first read voltage lower than the second read voltage to the word line adjacent to the sting selection line SSL or adjacent the ground selection line GSL. Accordingly, a soft program effect, which may occur at the memory cells connected to the word line adjacent to the string selection line or connected to the word line adjacent to the ground selection line, may be prevented in the development interval.

Figure 2:
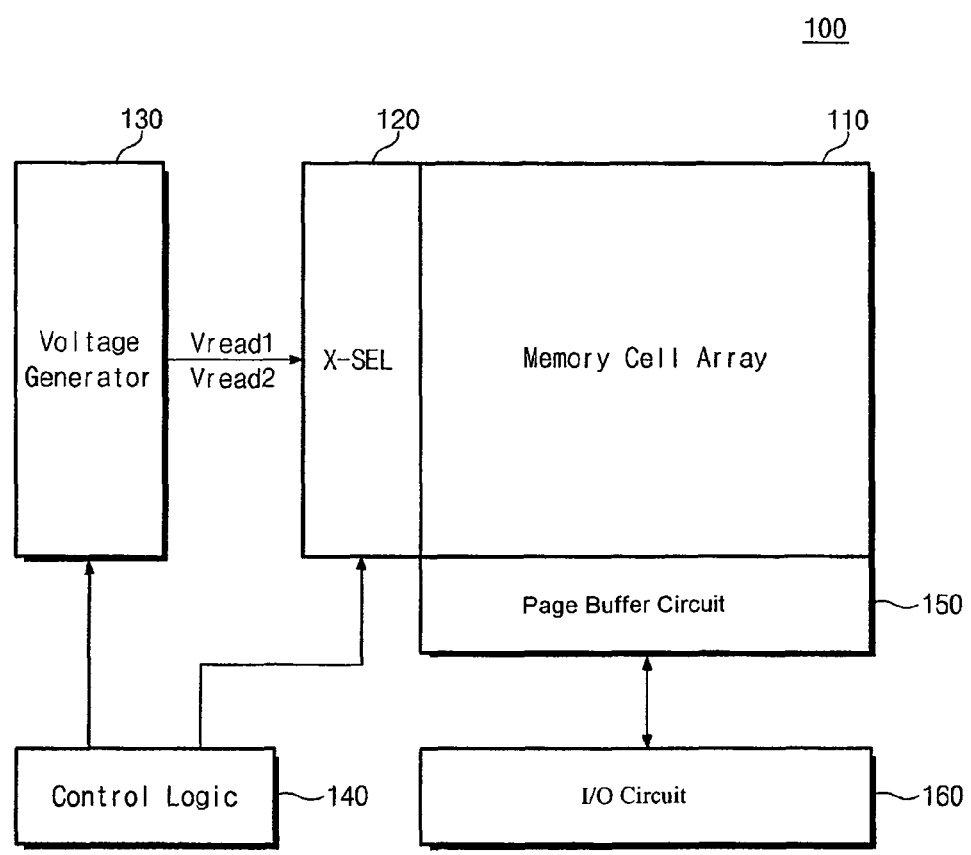
FIG. 2 illustrates a block diagram of a flash memory device according to an example embodiment.

FIG. 2 illustrates a block diagram of a flash memory device 100 according to an example embodiment.

Referring to FIG. 2, the flash memory device 100 may include a memory cell array 110, a row selection circuit 120, a voltage generating circuit 130, a control logic 140, and a page buffer circuit 150. The memory cell array 110 may include a plurality of memory blocks (not shown), each of which includes memory cells arranged at intersections of word lines and bit lines, as shown in FIG. 1.

During a read operation mode, the row selection circuit 120 may supply a ground voltage GND to a selected word line, and may supply first and second read voltages Vread1 and Vread2 to corresponding unselected word lines. The first read voltage Vread1 may be supplied to a word line WLn-1 adjacent to the string selection line SSL or to a word line WL0 adjacent to the ground selection line GSL, according to location of the selected word line. The second read voltage Vread2 may be supplied to the remaining word lines among the unselected word lines, i.e., except for the word line supplied with the first read voltage Vread1.

The page buffer circuit 150 may detect data stored in memory cells during a read operation. An input/output device 160 may provide the detected data to an external device.

During read operation, the voltage generating circuit 130 may generate the first and second read voltages Vread1 and Vread2 under the control of the control logic 140. The first read voltage Vread1 may be set at a lower level than the second read voltage Vread2. Where the voltage of the unselected word line WL0 or WL31 that is supplied with the first read voltage Vread1 is increased due to a coupling effect, the increased first read voltage Vread1 may not be higher than the second read voltage Vread2. The second read voltage Vread2 may be equal to the conventional read voltage Vread.

The control logic 140 may control operation of the flash memory device 100. During a read mode of operation, the control logic 140 may control the voltage generating circuit 130 so as to generate the first and second read voltages Vread1 and Vread2. The control logic 140 may also control the row selection circuit 120 so as to determine the read voltage and activation points of selection lines SSL and GSL supplied to the unselected word lines.

During a read mode of operation of the flash memory device 100, the first read voltage Vread1 may be supplied to one of a word line WLn-1 adjacent to the string selection line SSL and a word line WL0 adjacent to the ground selection line GSL, according to the location of the selected word line. The string selection line SSL or the ground selection line may be activated during a bit line development.

The voltage of the activated word line WLn-1 adjacent to the string selection line SSL or the word line WL0 adjacent to the ground selection line GSL may be increased by a coupling effect. However, the level of the first read voltage Vread1 may be lower than the level of the second read Vread2. Also, the first read voltage Vread1, when increased by the coupling effect, may not be higher than the second read voltage Vread2. Therefore, the memory cells connected to the word line WL0 or WL31 may be prevented from being soft programmed by the coupling effect. As a result, during the development interval in the read mode of operation, the flash memory device 100 may prevent a soft program effect that may otherwise occur in the memory cells connected to the word line adjacent to the string selection line SSL or connected to the word line adjacent to the ground selection line GSL.

Figure 3:
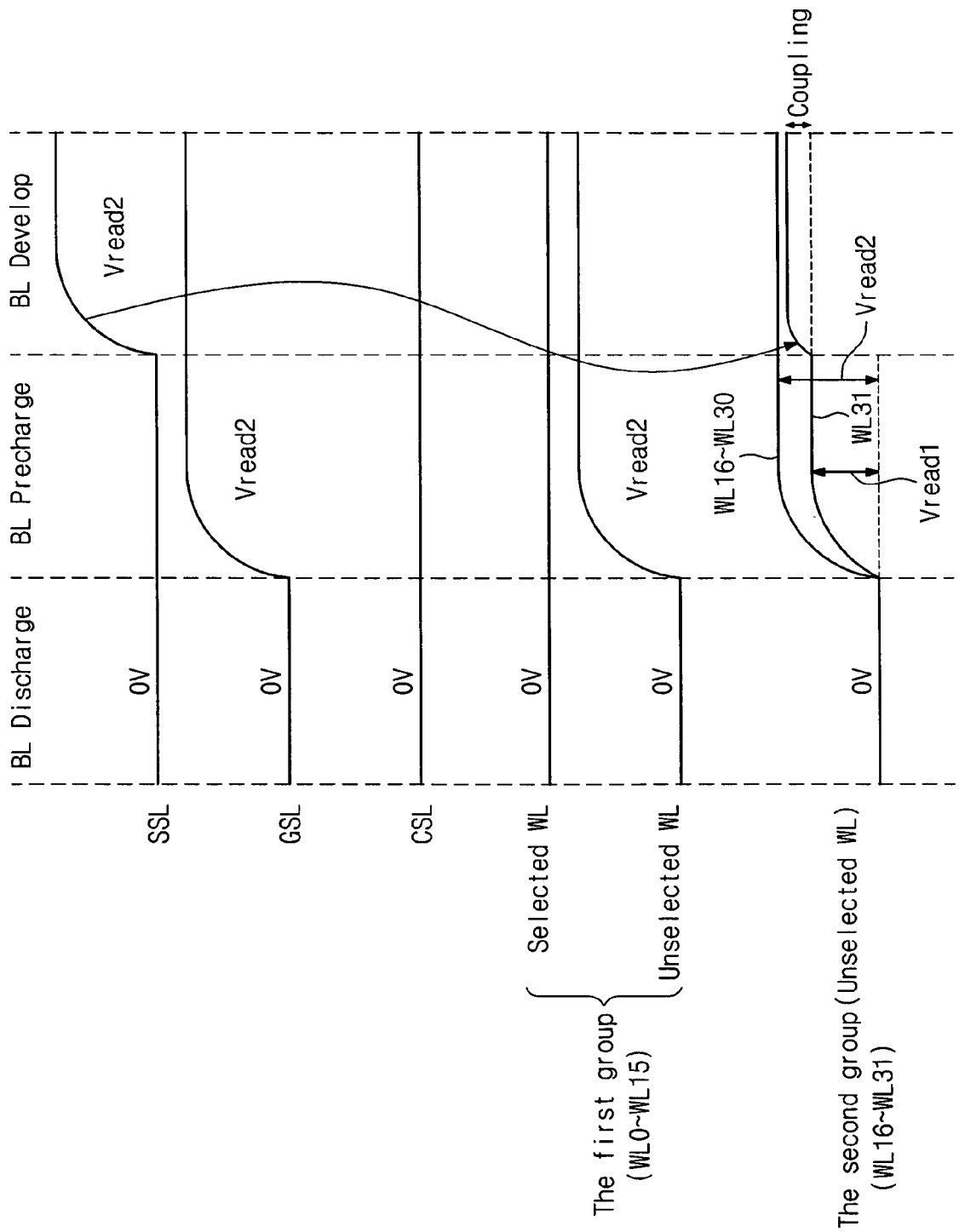
FIG. 3 and FIG. 4 illustrate timing diagrams of a read operation of the flash memory device of FIG. 2.
Figure 4:
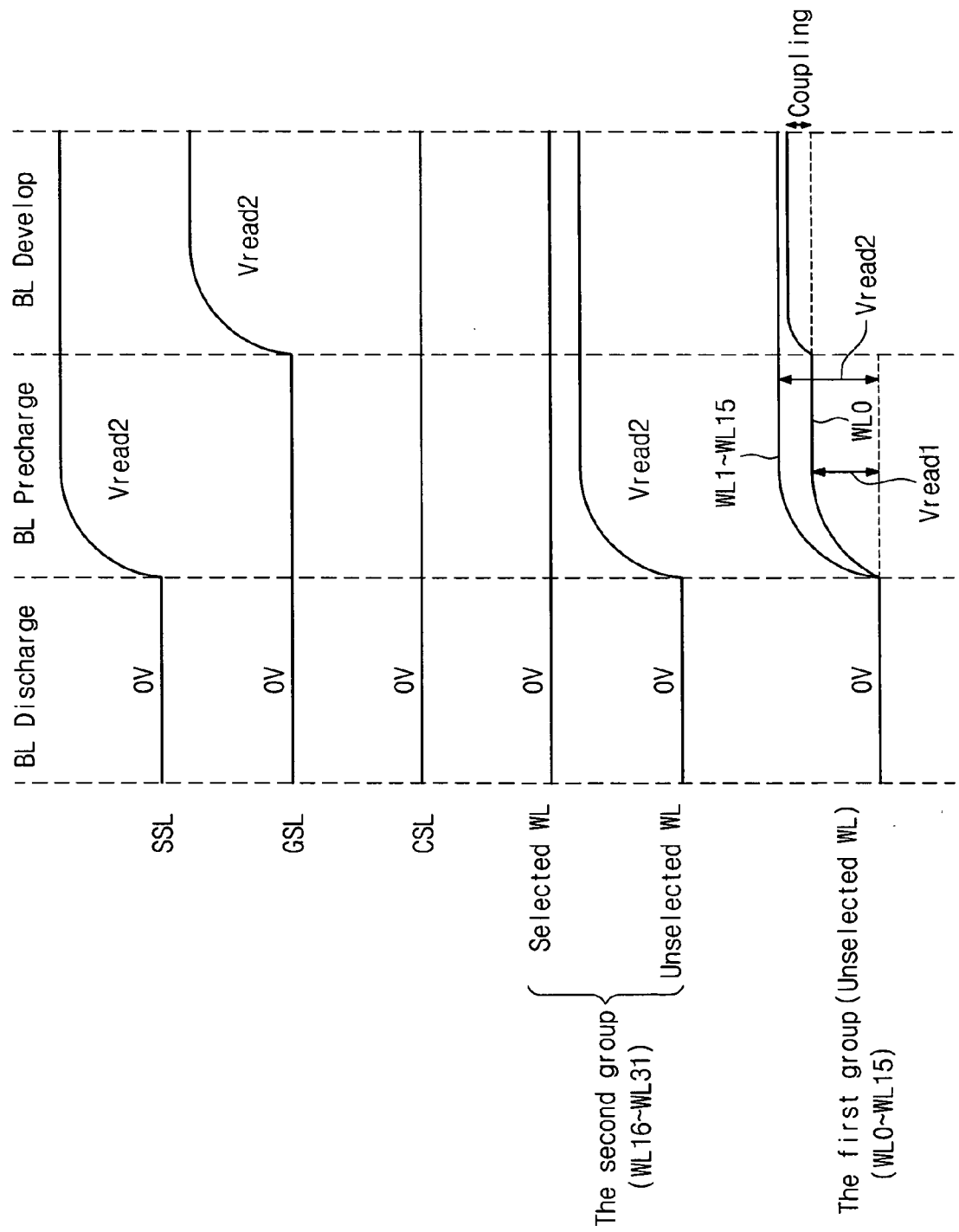

FIG. 3 and FIG. 4 illustrate timing diagrams of a read operation of the flash memory device of FIG. 2.

In the read operation of the flash memory device 100 that is described below, it is assumed that a memory block includes thirty-two word lines WL0 to WL31, which are divided into first and second group. The first group may include the word lines WL0 to WL15, and the second group may include the word lines WL16 to WL31. However, the described configuration is only an example, and the number and/or configuration of word line groups may be modified in various forms.

FIG. 3 illustrates a timing diagram of a read operation of a flash memory device 100 where the first group of word lines WL0 to WL15 is selected. FIG. 4 illustrates a timing diagram of a read operation of a flash memory device 100 where the second group of word lines WL16 to WL31 is selected.

A read operation of the flash memory device 100 will now be described with reference to FIG. 3, which shows the case where the first group of word lines WL0 to WL15 is selected.

Referring to FIG. 3, during a bit line discharge interval BL Discharge, a ground voltage 0V may be supplied to a string selection line SSL, to a ground selection line GSL, to a common source line CSL, and to word lines WL0 to WL31, respectively.

During a bit line precharge interval BL precharge, bit lines BL0 to BLm-1 may be precharged so as to have a predetermined precharge level. Also, as shown in FIG. 3, a second read voltage Vread2 may be supplied to the ground selection line GSL, and to unselected word lines of the first group WL0 to WL15 and the second group WL16 to WL31. The ground selection line GSL supplied with the second read voltage Vread2 may be activated. The ground voltage 0V may be supplied to the string selection line SSL, and the first read voltage Vread1 may be supplied to the unselected word line WL31 of the second group WL16 to WL31. The ground voltage 0V may be supplied to the selected word line of the first group WL0 to WL15.

The ground voltage 0V may be supplied to the string selection line SSL during the bit line precharge interval BL Precharge. Even if a cell of the selected word line is an erase cell, a cell string may not form an electric current path.

It is assumed that, during the bit line precharge interval, a second read voltage Vread2 is supplied to the string selection line SSL and to the ground selection line GSL, and that a memory cell connected to the selected word line is erased cell. In this case, as the erased cell is an on-cell, the cell string forms an electric current path. During the interval in which the bit lines are precharged, when the second read voltage Vread2 is supplied to the string selection line SSL and the ground selection line GSL, the flash memory device may consume power. However, the cell string of the flash memory device 100 does not form an electric current path during the interval in which the bit lines are precharged. Accordingly, the flash memory device 100 is configured to avoid unnecessary power consumption while the bit lines are being precharged.

As shown in FIG. 3, the second read voltage Vread2 may be supplied to the string selection line SSL during a bit line development interval BL Develop. Therefore, a voltage of the unselected word line WL31 adjacent to the activated string selection line SSL may be increased due to a coupling effect with the voltage supplied to the string selection line SSL. However, the first read voltage Vread1 may be lower than the second read voltage Vread2. Also, when the voltage of the unselected word line L31 supplied with the first read voltage Vread1 is increased due to a coupling effect, the first read voltage Vread1 may not be higher than the second read voltage Vread2. Therefore, the memory cells connected to the unselected word line WL31 may be prevented from being soft programmed by the coupling effect.

If the ground selection line GSL is supplied with a low voltage level L in the bit line precharge interval BL Precharge and the second read voltage Vread2 in the bit line development interval BL Develop, a problem may occur in a read operation. For example, if a word line WL0 is selected and the ground selection line GSL is supplied with the second read voltage Vread2 during bit line development interval BL Develop, the voltage of the selected word line selected may be increased due to a coupling effect. If the voltage of the selected word line WL0 is increased, a read operation may not be performed normally. Therefore, where the selected word line belongs to the first group WL0 to WL15, the second read voltage Vread2 may be supplied to the ground selection line GSL during the bit line precharge interval BL Precharge.

A read operation of the flash memory device 100 will be described with reference to FIG. 4, which illustrates a case where a word line of the second group WL16 to WL31 is selected.

An operation performed during a bit line discharge interval BL Discharge is identical to FIG. 3, and description thereof is thus omitted.

Referring to FIG. 4, during a bit line precharge interval BL Precharge, a second read voltage Vread2 may be supplied to the string selection line SSL, the unselected word lines of the first group WL0 to WL15, and the word lines of the second group WL16 to WL31. The string selection line SSL supplied with the second read voltage Vread2 may be activated. A ground voltage 0V may be supplied to a ground selection line GSL, and a first read voltage Vread1 may be supplied to an unselected word line WL0 of the first group WL0 to WL15. The ground voltage 0V may be supplied to the selected word line of the second group WL16 to WL31. As the ground voltage 0V is supplied to the ground selection line GSL during the bit line precharge interval BL Precharge, a cell string does not form an electric current path, even when the cell of the selected word line is an erase cell. Therefore, the flash memory device 100 may avoid unnecessary power consumption while the bit lines are being precharged.

As shown in FIG. 4, a second read voltage Vread2 may be supplied to the ground selection line GSL during the bit line development interval BL Develop. Therefore, a voltage of the unselected word line WL0 adjacent to the activated ground selection line GSL may be increased due to a coupling effect with the voltage supplied to the ground selection line GSL. However, the first read voltage Vread1 may be lower than the second Vread2. Thus, if the voltage of the unselected word line WL31 supplied with the first read voltage Vread1 is increased due to a coupling effect, the first read voltage Vread1 thus increased may not be higher than the second read voltage Vread2. Therefore, the memory cells connected to the unselected word line WL0 may be prevented from being soft programmed by coupling.

When the string selection line SSL is supplied with a low voltage level L in the bit line precharge interval BL Precharge and is supplied with the second read voltage Vread2 in the bit line development interval BL Develop, a problem may occur in a read operation. For example, if a word line WL31 is selected and the second read voltage Vread2 is applied to the string selection line SSL during the bit line development interval BL Develop, the voltage of the selected word line WL31 may be increased due to a coupling effect. When the voltage of the selected word line WL31 is increased, a read operation may not be performed normally. Therefore, where the selected word line belongs to the first group WL16 to WL31, the second read voltage Vread2 may be supplied to the string selection line SSL during the bit line precharge interval BL Precharge. As a result, during the development interval of the read operation mode, the flash memory device may prevent a soft program effect that may otherwise occur in the memory cells connected to the word line adjacent to the string selection line or connected to the word line adjacent to the ground selection line.

Figure 5:
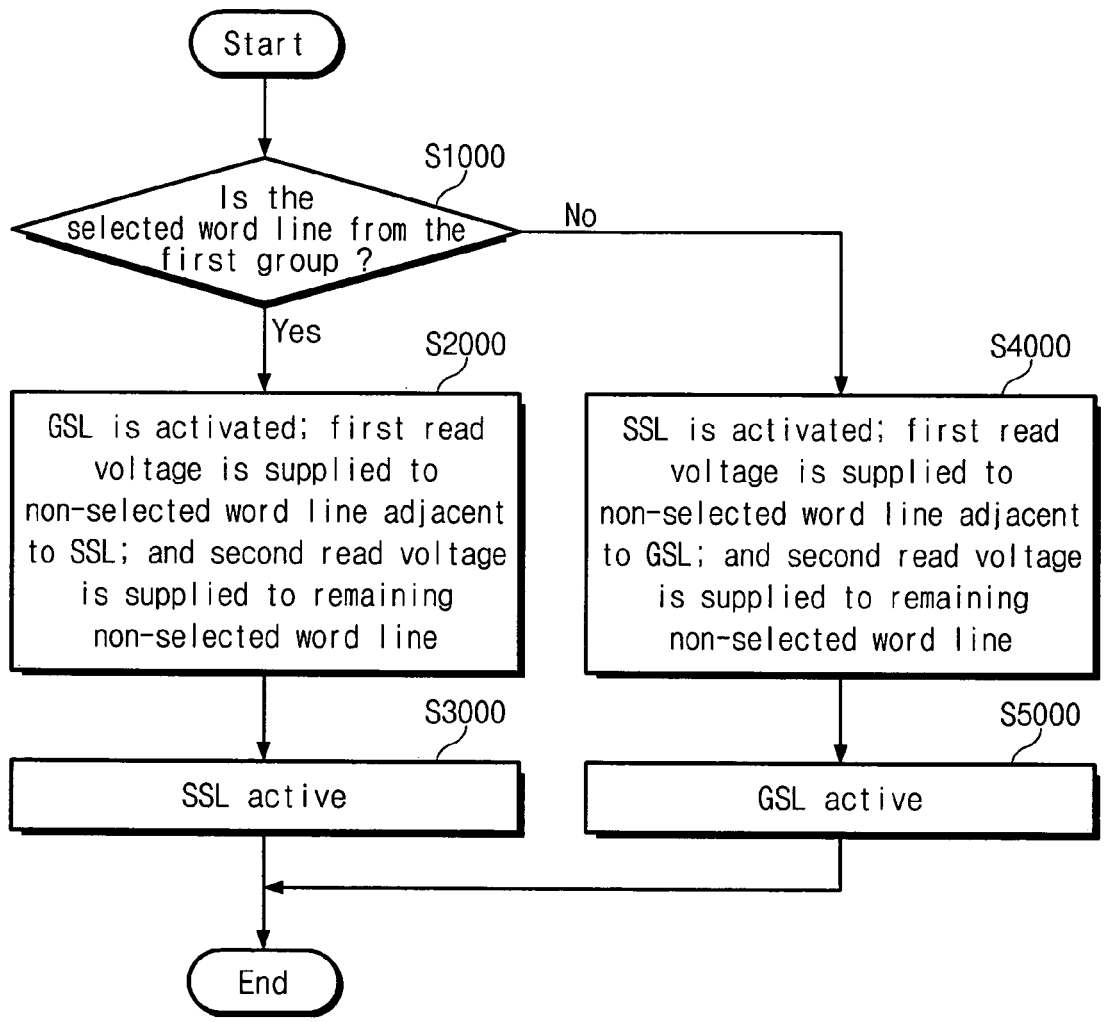
FIG. 5 illustrates a flow chart of a read operation of the flash memory device according to an example embodiment.

FIG. 5 illustrates a flow chart of a read operation of a flash memory device according to an example embodiment.

Referring to FIG. 5, in a read mode of operation, in operation S1000, it is determined whether a selected word line belongs to the first group of word lines WL0 to WL15 or to the second group of word lines WL16 to WL31.

Where the selected word line belongs to the first group of word lines WL0 to WL15, in operation S2000, the ground selection line GSL may be activated when the bit lines are precharged, and the first read voltage Vread1 may be supplied to the unselected word line adjacent to the string selection line SSL. Also in operation S2000, the second read voltage Vread2 may be supplied to the remaining unselected word lines, except for the unselected word line supplied with the first read voltage Vread1.

In operation S3000, the string selection line SSL may be activated during the bit line development.

Where the selected word line belongs to the second group WL16 to WL31, operation S1000 may be followed by operation S4000. In operation S4000, the string selection line SSL may be activated when the bit lines are precharged, the first read voltage Vread1 may be supplied to the unselected word line adjacent to the ground selection line GSL, and the second read voltage Vread2 may be supplied to the remaining unselected word lines, except for the unselected word line supplied with the first read voltage Vread1.

In operation S5000, the ground selection line GSL may be activated during the bit line development.

As described above, the first read voltage Vread1 may be set at a lower level than the second read voltage Vread2. If the voltage of the unselected word line WL0 or WL31 supplied with the first read voltage Vread1 is increased due to a coupling effect, the first read voltage Vread1 thus increased may not be higher than the second read voltage Vread2. Therefore, when the first read voltage Vread1 is supplied to the word line WL31 or the word line WL0, a soft program effect of the memory cells connected to the word line WL31 or the word line WL0 may be prevented during a bit line development interval. As a result, during the development interval in the read mode of operation, the flash memory device may prevent a soft program effect that may otherwise occur in the memory cells connected to the word line adjacent to the string selection line or connected to the word line adjacent to the ground selection line.

Figure 6:
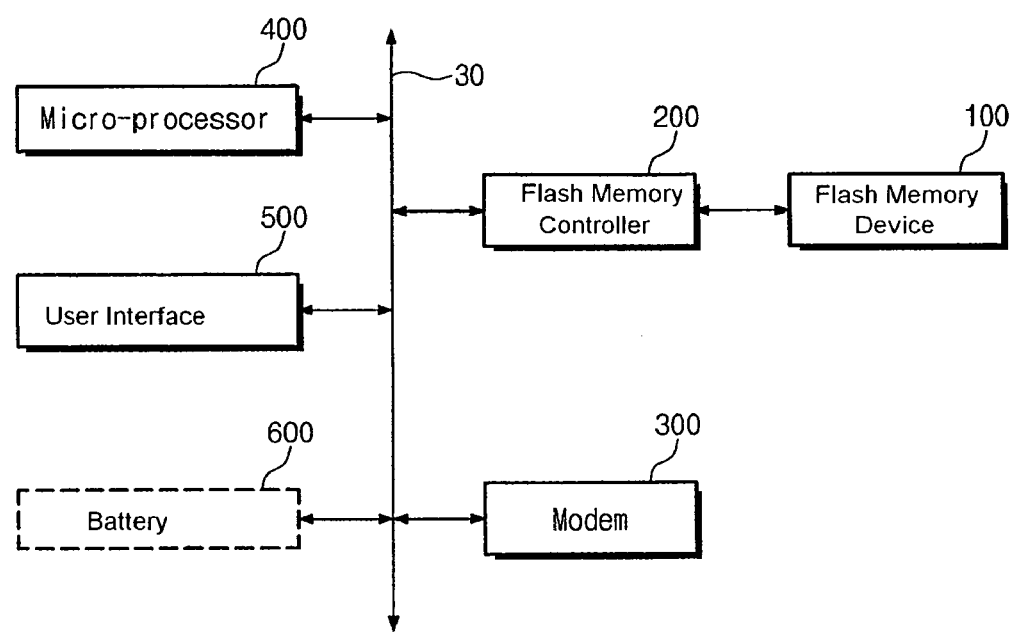
FIG. 6 illustrates a schematic view of a computing system including the flash memory device according to an embodiment.

FIG. 6 illustrates a schematic view of a computing system including a flash memory device according to an embodiment.

Referring to FIG. 6, the computing system may include a microprocessor 400, a user interface 500, a modem 300, e.g., a baseband chipset, and may also include a flash memory controller 200 and a flash memory device 100, each of which may be electrically connected to a bus 30. The flash memory controller 200 and the flash memory device 100 may be part of a flash memory system.

The flash memory device 100 may be substantially identical to that of FIG. 2. Data, e.g., N-bit data processed/to be processed (N is 1 or a larger integer) by the microprocessor 400, may be stored in the flash memory device 100 through the flash memory controller 200. Where the computing system is a mobile device, a battery 600 for supplying an operation voltage to the computing system may be provided. Although not shown in the drawings, an application chipset, camera image processor (CIS), and mobile DRAM may be further provided in the computing system.

The flash memory device may be implemented as a nonvolatile memory device for retaining stored instructions and/or data without power being supplied thereto. In mobile devices, e.g., cellular phones, personal digital assistants (PDA's), digital cameras, portable game consoles, MP3 players, GPS units, etc., the flash memory device may be used as code storage, i.e., instruction storage, as well as data storage. The flash memory device may also be used in home applications, for example, HDTVs, routers, etc.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device, comprising:
a memory block including word lines arranged between a first selection line and a second selection line, the word lines being divided into a first group and a second group;
a control logic configured to determine an activation order of the first and second selection lines and determine first and second read voltages to be supplied to unselected word lines, the control logic determining the activation order according to whether a selected word line belongs to the first group or the second group; and
a row selection circuit configured to, during a read operation, drive the unselected word lines with the first and second read voltages, and activate the first and second selection lines, according to the control logic.

2. The flash memory device as claimed in claim 1, wherein:
the first group is adjacent to the first selection line, the first selection line being a ground selection line, and
the second group is adjacent to the second selection line, the second selection line being a string selection line.

3. The flash memory device as claimed in claim 2, wherein, when the selected word line belongs to the first group, the row selection circuit drives the unselected word line adjacent to the second selection line with the first read voltage.

4. The flash memory device as claimed in claim 3, wherein the row selection circuit supplies the second read voltage to the remaining unselected word line, except for the unselected word line that is supplied with the first read voltage.

5. The flash memory device as claimed in claim 4, wherein:
the second selection line is activated during a bit line development interval, and
the first selection line is activated during a bit line precharge interval.

6. The flash memory device as claimed in claim 2, wherein, when the selected word line belongs to the second group, the row selection circuit drives the unselected word line adjacent to the first selection line with the first read voltage.

7. The flash memory device as claimed in claim 6, wherein the row selection circuit supplies the second read voltage to the remaining unselected word line, except for the unselected word line supplied with the first read voltage.

8. The flash memory device as claimed in claim 7, wherein:
the first selection line is activated during a bit line development interval, and
the second selection line is activated during a bit line precharge interval.

9. The flash memory device as claimed in claim 1, wherein the first read voltage is lower than the second read voltage.

10. The flash memory device as claimed in claim 9, wherein the first read voltage is set such that, when increased due to a coupling effect, the voltage is not higher than the second read voltage.

11. A memory system, comprising:
a flash memory device; and
a memory controller configured to control the flash memory device, wherein the flash memory device is the flash memory device as claimed in claim 1.

12. A computing system, comprising:
a microprocessor;
a flash memory device; and
a memory controller configured to control the flash memory device according to a request from the microprocessor, wherein the flash memory device is the flash memory device as claimed in claim 1.

13. A method of reading a flash memory device that includes a memory block having word lines arranged between first and second selection lines, the word lines being divided into a first group and a second group, the method comprising:
determining whether a selected word line belongs to the first group or the second group;
determining an activation order of the first and second selection lines according to whether the selected word line belongs to the first group or the second group;
determining first and second read voltages to be supplied to unselected word lines; and
during a read operation, driving the unselected word lines with the first and second read voltages, and activating the first and second selection lines.

14. The method as claimed in claim 13, wherein:
the first group is adjacent to the first selection line,
the second group is adjacent to the second selection line,
the first selection line is a ground selection line, and
the second selection line is a string selection line.

15. The method as claimed in claim 14, wherein:
the first read voltage is provided to a word line, adjacent to one of the selection lines, of unselected word lines of a group to which no selected word line belongs, and
the second read voltage is higher than the first read voltage and is provided to unselected word lines except for the word line adjacent to one of the selection lines.

16. The method as claimed in claim 15 further comprising:
activating the first selection line, and
activating the second selection line during a bit line development interval, wherein:
the first read voltage is supplied to the unselected word line adjacent to the second selection line during a bit line precharge interval, when the selected word line belongs to the first group, and
the second read voltage is supplied to the remaining unselected word lines that belong to the first and second groups.

17. The method as claimed in claim 14 further comprising:
activating the second selection line, and
activating the first selection line during a bit line development interval, wherein:
the first read voltage is supplied to the unselected word line adjacent to the first selection line during a bit line precharge interval, when the selected word line belongs to the second group, and
the second read voltage is supplied to the remaining unselected word lines that belong to the first and second groups.

* * * * *